United States Patent [19]
Funaki et al.

[11] Patent Number: 5,093,758
[45] Date of Patent: Mar. 3, 1992

[54] ELECTRICAL INSULATION FILM AND CONDENSER

[75] Inventors: Keisuke Funaki, Ichihara; Yuichi Ohki, Himeji, both of Japan

[73] Assignee: Idemitsu Kosan Co., Ltd., Tokyo, Japan

[21] Appl. No.: 589,637

[22] Filed: Sep. 28, 1990

[30] Foreign Application Priority Data

Oct. 9, 1989 [JP] Japan .................. 261953

[51] Int. Cl.$^5$ .......................... H01G 1/01; B32B 5/16
[52] U.S. Cl. ...................................... 361/323; 428/220
[58] Field of Search ............... 29/25.42; 361/323, 398, 361/399, 412, 413, 414; 428/220

[56] References Cited

U.S. PATENT DOCUMENTS

| | | | |
|---|---|---|---|
| 2,887,634 | 5/1959 | Peck et al. | 361/323 |
| 3,264,536 | 8/1966 | Robinson et al. | 361/323 |
| 4,680,353 | 7/1987 | Ishihara et al. | 526/160 |
| 4,748,209 | 5/1988 | Orikasa et al. | 525/240 |
| 4,910,639 | 3/1990 | Schloegl et al. | 361/323 |
| 4,937,133 | 6/1990 | Watanabe et al. | 428/209 |
| 5,017,657 | 5/1991 | Fiore et al. | 525/173 |

FOREIGN PATENT DOCUMENTS 318794 6/1989 European Pat. Off. .

OTHER PUBLICATIONS

Patent Abstracts of Japan, vol. 13, No. 442 (C-641) (3790) Oct. 4, 1990, & JP-A-01 168709, Syndiotactic Polystyrene Film, Apr. 7, 1989.
Database WPIL, AN-89-169217, Derwent Publications Ltd., London, GB & JP-A-01 110122, Apr. 26, 1989.

*Primary Examiner*—Donald A. Griffin
*Attorney, Agent, or Firm*—Frishauf, Holtz, Goodman & Woodward

[57] ABSTRACT

An electrical insulating film which comprises a styrene polymer having a syndiotactic configuration and containing not more than 1,000 ppm of residual aluminum derived from the catalyst used in the production of the styrene polymer, and not more than 3,000 ppm of residual styrene monomer, and a condenser comprising metal electrodes and the above film which is 0.5 to 30 μm thick and has crystallinity of not less than 25%, are disclosed.

14 Claims, No Drawings

ELECTRICAL INSULATION FILM AND CONDENSER

BACKGROUND OF THE INVENTION

1. Field of the Invention

The present invention relates to an electrical insulating film and a condenser, more specifically, it relates to an electrical insulating film which comprises a specific styrene polymer excellent in electrical insulating properties, heat resistance and the like, and further relates to a condenser which comprises said electrical insulating film and metal electrodes.

2. Description of the Related Arts

Hitherto, polyethylene terephthalate (PET), polypropylene (PP), styrene polymer having an atactic configuration and the like have been used as materials for electrical insulating films. However, these materials have insufficient heat resistance. Particularly, they have low resistance to heat of soldering during production of SMD (surface mount device) which has recently become an particularly important problem, resulting in difficulty in processing operation.

Accordingly, polyphenylene sulfide (PPS), polyimide and the like have been developed as a heat resistant material. However, these materials are not practical because they are expensive and have problem in insulating properties.

The film comprising styrene polymer having a syndiotactic configuration, which the present inventors have previously proposed (see Japanese Patent Application Laid-Open No. 316246/1989) is excellent in heat resistance, chemical resistance, electrical properties, mechanical strength and the like, and expected to be used as an electrical insulating material instead of the above materials.

However, the previously proposed film which comprises a styrene polymer having a syndiotactic configuration has various problems for practical use, for example, when it is formed into a thin film, it may fail to show sufficient dielectric strength, and dielectric dissipation factor particularly in high frequency region may be high.

Accordingly, the present inventors have studied intensively to develop a film comprising styrene polymer having a syndiotactic configuration which can be practically used as an electrical insulating material. As the result, it has been found that a film of the styrene polymer, wherein impurities mixed during an operation for production thereof is controlled at low concentration, is adequate to the above purpose and suitable an as electrical insulating film. Further, it has been found that the above film having a certain thickness and crystallinity provided with metal electrodes is useful as a condenser. The present invention has been accomplished based on such findings.

SUMMARY OF THE INVENTION

That is, the present invention provides an electrical insulating film comprising a styrene polymer having a syndiotactic configuration which contains not more than 1,000 ppm of residual aluminum derived from the catalyst use in the production of the styrene polymer, and not more than 3,000 ppm of residual styrene monomer. Further, the present invention also provides a condenser which comprises metal electrodes and a 0.5 to 30 μm thick electrical insulating film comprising a styrene polymer having crystallinity of not less than 25% and a syndiotactic configuration which contains not more than 1,000 ppm of residual aluminum derived from catalyst used in the production of the styrene polymer, and not more than 3,000 ppm of residual styrene monomer.

Here, a styrene polymer having a syndiotactic configuration means a styrene polymer wherein stereochemical structure is a syndiotactic configuration, that is, the stereostructure in which phenyl groups or substituted phenyl groups as side chains are located alternately in opposite directions relative to the main chain consisting of carboncarbon bonds. Tacticity is quantitatively determined by the nuclear magnetic resonance method ($^{13}$C-NMR method) using carbon isotope. The tacticity measured by the $^{13}$C-NMR method can be indicated in terms of proportions of structural units continuously connected to each other, i.e., a diad in which two structural units are connected to each other, a triad in which three structural units are connected to each other and a pentad in which five structural units are connected to each other. The styrene polymer having a syndiotactic configuration in the present invention means styrene polymer having such syndiotacticity that the proportion of racemic diad is at least 75%, preferably at least 85%, or proportions of racemic pentad is at least 30% and preferably at least 50%. Examples of the styrene polymer include styrene, poly(alkylstyrene), poly(halogenated styrene), poly(alkoxystyrene), poly(vinylbenzoate), hydrogenated polymers thereof and mixture thereof, or copolymers containing these structural units. The poly(alkylstyrene) includes poly(methylstyrene), poly(ethylstyrene), poly(propylstyrene), poly(butylstyrene), poly(phenylstyrene), poly(vinylnaphthalene), poly(vinylstyrene), poly(acenaphthylene); and the poly(halogenated styrene) includes poly(chlorostyrene), poly(bromostyrene) and poly(fluorostyrene). The poly(alkoxystyrene)includes poly(methoxystyrene), poly(ethoxystyrene). Of these, a particularly preferred styrene polymer includes polystyrene, poly(p-methylstyrene), poly(m-methylstyrene), poly(p-tert-butylstyrene), poly(p-chlorostyrene), poly(m-chlorostyrene), poly(p-fluorostyrene) and further a copolymer of styrene and p-methylstyrene (see Japanese Patent Application Laid-Open No. 187708/1987).

Comonomer of the styrene copolymer includes, in addition to the above-described monomer of styrene polymer, olefin monomer such as ethylene, propylene, butene, hexene, octene; diene monomer such as butadiene, isoprene; cyclic diene monomer or polar vinyl monomer such as methyl methacrylate, maleic anhydride, acrylonitrile.

Molecular weight of the styrene polymer is not particularly limited, but the styrene polymers having weight average molecular weight of 10,000 to 3,000,000, especially, 50,000 to 1,500,000 are most suitable. When weight average molecular weight is less than 10,000, the product may not be sufficiently stretched. Further, the range of molecular-weight distribution is not limited and various styrenes can be used. The value, (weight average molecular weight (Mw)/number average molecular weight (Mn)), is preferably 1.5 to 8. The styrene polymer having a syndiotactic configuration is much superior in heat resistance to the conventional styrene polymer having an atactic configuration The styrene polymer of the present invention having a syndiotactic configuration is as described above and is of high purity with extremely low impurities content. That is, the aluminum content in the styrene polymer should be not more than 1,000 ppm, preferably 800 ppm, said aluminum being derived from the catalyst used in the process for production wherein a styrene monomer is polymerized to produce the styrene polymer, and the residual styrene monomer content in the styrene polymer should be not more than 3,000 ppm, preferably, 2,000 ppm.

The aluminum in the styrene polymer is derived from the catalyst comprising titanium compound and aluminum compound used conventionally. The styrene monomer is unreacted monomer among starting monomers used for production of the styrene polymer and includes the other residue monomer when a monomer other than styrene monomer is used to obtain a copolymer.

The methods for production of such styrene polymer of high purity includes various ones as shown below. In this case, the monomer corresponding to the above-described polymer is used as a starting material. Firstly for control of the residual aluminum content and residual styrene monomer content within the above range, (1) a method in which a highly active catalyst is used to produce a styrene polymer (see, Japanese Patent Application Laid-Open No. 294705/1989) or (2) a method which comprises deashing and washing, that is, a method wherein a styrene monomer is polymerized using a conventional organometallic compound of group IVA described, for example, in Japanese Patent Application Laid-Open No. 187708/1987 (e.g. an organic titanium compound) and alkylaluminoxane such as methylaluminoxane as the catalyst components, then the resulting styrene polymer having a syndiotactic configuration is deashed with a solution of acid or alkali in a suitable solvent, and washed with a suitable solvent.

As mentioned above, a styrene polymer having a syndiotactic configuration with less residual aluminum content can be obtained by the method (1) or (2). Further, the product is treated by the following method (3) or (4) to control the residual styrene monomer content below 5,000 ppm. When the residual styrene monomer content of the product in this step is not more than 5,000 ppm, the product may be formed into a film with the residue content of the desired value, i.e. 3,000 ppm or less.

(3) A method wherein the above styrene polymer is dried under reduced pressure.

For drying under reduced pressure, it is efficient to set the drying temperature at the glass transition temperature of the polymer or higher. (4) A method wherein the above styrene polymer is degassed by an extruder.

Such treatment provides a styrene polymer of high purity which contains less residual aluminum and residual styrene monomer and has a high degree of syndiotactic configuration.

It is preferable from the viewpoint of electrical properties to control the content of the residual group IVA element compound particularly derived from the catalyst, for example, the residual titanium content to not more than 10 ppm, preferably not more than 7 ppm, and the content of the halogen compound to not more than 50 ppm, and the content of alkali metal compound to not more than 100 ppm, by deashing operation.

Electrically inactive inorganic filler, antioxidant, antistatic agent, flame retardant or other resin may be added to thus produced styrene polymer as needed, so long as they do not inhibit the objective effect of the present invention.

In this case, the electrically inactive inorganic filler means oxide, hydroxide, sulfide, nitride, halide, carbonate, sulfate, acetate, phosphate, phosphite, organic carboxylate, silcate, titanate or borate of the group IA, IIA, IVA, VIA, VIIA, VIII, IB, IIB, IIIB or IVB element, and hydrate compound thereof, complex compound containing them as a center, natural mineral particles.

For example, group IA element compound such as lithium fluoride, borax (hydrate salt of sodium borate); group IIA element compound such as magnesium carbonate, magnesium phosphate, magnesium oxide (magnesia), magnesium chloride, magnesium acetate, magnesium fluoride, magnesium titanate, magnesium silicate, hydrate salt of magnesium silicate (talc), calcium carbonate, calcium phosphate, calcium phosphite, calcium sulfate (gypsum), calcium acetate, calcium terephthalate, calcium hydroxide, calcium silicate, calcium fluoride, calcium titanate, strontium titanate, barium carbonate, barium phosphate, barium sulfate, barium phosphite; group IVA element compound such as titanium dioxide (titania), titanium mono-oxide, titanium nitride, zirconium dioxide (zirconia), zirconium monooxide; group VIA element compound such as molybdenum dioxide, molybdenum trioxide, molubdenum sulfide; group VIIA element compound such as manganese chloride, manganese acetate; group VIII element compound such as cobalt chloride, cobalt acetate; group IB element compound such as copper iodide; group IIB element compound such as zinc oxide, zinc acetate; group IIIB element compound such as aluminum oxide (alumina), aluminum hydroxide, aluminum fluoride, aluminosilicate (alumina silicate, kaolin, kaolinite); group IVB element compound such as plumbago, carbon, graphite, glass; particulate natural mineral such as carnallite, kainite, isinglass (mica, phlogoite), and pyrolusite.

The average particle diameter of the inorganic filler is not particularly limited, but preferably, 0.01 to 3 $\mu$m, more preferably, 0.01 to 1 $\mu$m. The content in the molded product is 0.001 to 1 wt%, preferably, 0.005 to 1 wt%. The inorganic filler is contained in the final molded product and the method for compounding is not limited. For example, it may be added in the optional step during polymerization, or added in the optional step during melt extrusion.

The other resin which can be added to the above styrene polymer includes various kinds, for example, styrene polymer having an atactic configuration, styrene polymer having an isotactic configuration, polyphenylene ether and the like. Such resins may be readily compatibilized with the above styrene polymer having a syndiotactic configuration and effective to control crystallization when pre-molded product for stretching is prepared, thereby providing a film with enhanced stretching properties and excellent in dynamic properties, whose stretching conditions may be readily controlled. Among them, when styrene polymer having an atactic and/or isotactic configuration is compounded, it is preferably composed of the same monomers as those of the styrene polymer having a syndiotactic configuration. The content of the compatible resin component is 70 to 1 wt%, preferably, 50 to 2 wt%. When the content of the compatible resin component exceeds 70 wt%, heat resistance, which is an advantage of the styrene polymer having a syndiotactic configuration, may be undesirably spoiled. The other non-compatible resins which can be added to the polymer of the present invention include, a polyolefin such as polyethylene, polypropylene, polybutene, polypentene; a polyester such as polyethylene terephthalate, polybutylene terephthalate, polyethylene naphthalate; a polyamide such as nylon-6, nylon-6,6; a polythioether such as polyphenylene sulfide, a polycarbonate, a polyarylate, a polysulfone, a polyether ether ketone, a polyethersulfone, a polyimide, a halogenated vinyl polymer such as Teflon, an acrylic polymer such as polymerthyl methacrylate, a polyvinyl alcohol, and all but the aforementioned compatible resins. There are also cross linked resins containing the aforementioned compatible resins.

When the styrene polymer of the present invention having a syndiotactic configuration contains a small amount of the above resin, such resin, which is incompatible with the above styrene polymer, can be dispersed like islands in the styrene polymer having a syndiotactic configuration. Accordingly, it is effective to provide proper gross and to improve smoothness of the surface after stretching. The content of these non-compatible resin is 50 to 2 wt% for the purpose of providing gloss, and 0.001 to 5 wt% for the purpose of controlling the surface properties. When the temperature at which the product is used is high, no-compatible resin with considerable heat resistance is preferably used.

The present invention is an electrical insulating film formed using the aforementioned styrene polymer of high purity having a syndiotactic configuration as a starting material. The process for production of such film is not particularly limited. The film may be produced by the process wherein these materials are heat-melted to obtain pre-molded product, then heat-stretched and heat-treated, if necessary.

The operations from heat melting to heat treatment (annealing) will be explained in detail.

Firstly, thus obtained styrene polymer as a material for molding is usually extruded to give a pre-molded product for stretching (film, sheet or tube). In this molding, the aforementioned heat-melted material for molding is generally molded into a desired form by an extruder. Alternatively, the material for molding may be molded without heat melting while it is softened. An extruder used in this case may be either a uniaxial extruder or a biaxial extruder, with or without vent. A uniaxial tandem type is preferred. Using an extruder with a suitable mesh, impurities and contaminants can be removed. As for the shape of the mesh, for example, plane or cylinder mesh may be properly selected and used.

The extrusion conditions are not particularly limited and properly selected depending on the various circumstances. Preferably, the temperature is selected in the range from melting point to the temperature 50° C. higher than decomposition temperature of the material for molding, and shear stress is not more than $5 \times 10^6$ dyne/cm$^2$. The die used is a T-die, a ring die or the like.

After the above extrusion, the resulting pre-molded product is cooled and solidified. As a refrigerant used in this step, for example, gas, liquid, metal roller and the like may be used. When a metal roller is used, it is effective to prevent uneven thickness and surge by using air knife, air chamber, touch roll, electrostatic application and the like.

The temperature of cool solidification is generally 0° C. to 30° C. higher than glass transition temperature of the premolded product for stretching, preferably from 70° C. lower than glass transition temperature to glass transition temperature. The cooling rate is properly selected within the range from 200 to 3° C./sec.

In the present invention, the cooled and solidified pre-molded product is preferably uni- or bi-axially stretched. For biaxial stretching, transverse direction (TD) stretching and machine direction (MD) stretching may be simultaneously conducted, or successively conducted in suitable order. Alternatively, stretching may be conducted in one step, or in multiple steps. Stretch ratio is not less than 2, preferably not less than 3 as a ratio of area. When stretch ratio is within this range, crystallinity of the film becomes not less than 25%, and product with good physical properties can be obtained.

Methods for stretching include various methods such as a method using a tenter, a method wherein the product is stretched between rollers, a method by bubbling using a pressure of a gas, a method by rolling and the like. These methods may be applied singly or in combination. The temperature for stretching is generally set between glass transition temperature of the pre-molded product and melting point of the pre-molded product. The stretching rate is generally $1 \times 10$ to $1 \times 10^5$ %/min., preferably, $1 \times 10^3$ to $1 \times 10^5$ %/min. It is preferable to conduct heat treatment (annealing or heat setting) for the stretched film obtained by stretching under the aforementioned conditions when dimensional stability, heat resistance, strength balance of the surface of the film are further required. Heat setting may be conducted by the usual method. It can be conducted by maintaining the stretched film in the temperature range from glass transition temperature to melting point of the film, preferably, 100° C. lower than melting point to a little lower than melting point for 0.5 to 120 seconds under a state of tension, a relaxed state or a state of controlling shrinkage. Such heat setting may be conducted twice or more changing the conditions within the above range. The heat setting may be conducted in an atmosphere of inert gas such as argon gas, nitrogen gas or the like.

Thus produced film of the present invention has excellent heat resistance and crystallinity is generally not less than 25%. Further, the film of 0.5 to 500 μm thickness has low dielectric dissipation factor (1 MHz, room temperature), i.e., not more than 0.002 and has extremely good dielectric breakdown strength. For example, when the 7 thickness of the film is not more than 20 μm, dielectric breakdown voltage is not less than 150 kV/mm (room temperature). Accordingly, among these films, 0.5 to 12 μm thick films, 20 to 150 μm thick films, 100 to 500 μm thick films and 10 to 50 μm thick films are suitably used as plastic dielectric, base meterials for flexible printed boards, general insulating plates and insulating tapes, respectively.

The condenser of the present invention comprises an aforementioned insulating film with crystallinity of 25% or more and thickness of 0.5 to 30 μm, and metal electrodes provided on the film.

The base film (dielectric) for the condenser of the present invention is a film of the above styrene polymer having syndiotactic configuration (hereinafter referred to as SPS film) and has crystallinity of not less than 25%, preferably not less than 30%. When crystallinity is less than 25%, the film may shrink at the temperature higher than glass transition temperature, resulting in adverse effect on dielectric properties. The thickness is 0.5 to 30 μm, preferably, 0.5 to 15 μm. When the thickness is less than 0.5 μm, it is difficult to form film, and when it exceeds 30 μm, the condenser may undesirably become larger.

The material for metal film of the metal electrode used for the condenser of the present invention is not particularly limited. Aluminum, zinc, nickel, chromium, copper, or alloy thereof is preferred.

The condenser of the present invention may not be particularly limited so long as it is composed essentially of the above SPS film and metal electrodes provided on the film.

The shape of the condenser of the present invention may be either ordinary type with lead wire or that without lead wire which is directly soldered (so-called chip condenser).

The SPS film itself is not affected by moisture of atmosphere, but when the electrode is formed by a thin film of aluminum, which is affected by moisture of atmosphere, it is preferable to form a jacket enclosing the condenser.

The material for such jacket includes metal such as aluminum, inorganic material such as glass, plastics and the like. For chip condenser, resin composition with softening temperature of not lower than 200° C., preferably not lower than 240° C. is preferred.

The preferable process for production of the condenser in the present invention will be explained.

Using the SPS film as a dielectric and metal film as an electrode, condenser element is formed by the known method. That is, when metallic foil is used as an electrode, a wind-up method wherein the shredded film and metallic foil are laminated and wound up into cylinder can be employed, and when a thin film of metal is used as an electrode, a method wherein a thin film layer of metal is formed on the film by metallizing method, metal plating method or the like, then the product is formed into a condenser element.

In both cases, the product after winding is pressed in the vertical direction to the surface of the film at the temperature from ambient temperature to ca 200° C. to stabilize the capacity and dielectric breakdown voltage.

In the present invention, a condenser means one of passive circuit elements of an electric circuit, which is provided with a electrostatic capacity between two electrodes by providing a pair of electrodes consisting of conductor which are separated by a dielectric, and has the same meaning as that called as an accumulator or a capacitor.

A metal foil means a self-supporting metal membrane and its thickness is preferably 3 to 15 μm.

A thin film of metal is a metal film which is not self-supporting and formed on the surface of the aforementioned film as a substrate by a metallizing method, a metal plating method or the like. The thickness is preferably 0.01 to 0.5 μm.

The condenser of the present invention is characterized by having the above SPS film as a dielectric, and an insulating film other than SPS film may coexist with SPS film between electrodes without any trouble so long as it should not spoil the essential advantage of the condenser having stretched film of styrene polymer having a syndiotactic configuration as dielectric, for example, the temperature properties, frequency properties.

When a metal film layer is formed on the film, treatment for enhancement of adhesion such as corona treatment, plasma treatment and the like may be previously conducted onto the surface of the film.

If necessary, the above condenser element may be treated to make its edge face conductive, lead wire is fixed or a jacket is formed to give a condenser.

Further, the condenser of the present invention is dipped in oil, electrolytic solution or the like to give a so-called dipping condenser.

Thus obtained condenser is excellent in heat resistance and electrical properties.

As mentioned above, the electrical insulating film of the present invention has high heat resistance which is a characteristic of the raw material, i.e. styrene polymer, and resistant to a treatment at a high temperature such as soldering. Further, since it is a film of high purity containing less impurities, dielectric dissipation factor is extremely low and dielectric breakdown voltage is high, that is, the film is excellent in electrical properties.

Thus, the electrical insulating film of the present invention can be widely used as an electrical insulating material, for example, as a condenser, a member for distributing board, insulating film, insulating tape or the like.

Moreover, a condenser prepared by providing metal electrodes on the above insulating film has high heat stability and low dielectric dissipation factor (tan δ) which is a change in capacity with the change of frequency, which hardly changes with temperature.

The condenser of the present invention which is resistant to soldering can be used as a so-called chip condenser without having lead wire and directly soldered onto a printed plate board. It is definitely superior to the conventional film condensers in package efficiency.

Accordingly, the condenser of the present invention shows excellent characteristics when used under any circumstances and can be applied for producing SMD. Thus, it is useful for miniaturization of circuit plate and enhancement of efficiency of operation.

Accordingly, the condenser of the present invention can be widely and effectively used for various application, for example, general electronic equipment, heat resistance, tone quality, oscillating circuit, high voltage electronic equipment, high frequency circuit, radio interference suppression.

The present invention will be described in more detail with reference to examples and comparative examples.

Reference Example 1

(1) Preparation of contact product of trimethylaluminum and water

In a 500-milliliter glass vessel which had been purged with argon were placed 17.8 g (71 mmol) of copper sulfate pentahydrate ($CuSO_4.5H_2O$), 200 ml of toluene and 24 ml (250 mmol) of trimethylaluminum, which were then reacted at 40° C. for 8 hours. Then, solid component was separated from the reaction mixture to prepare solution, and toluene was distilled away from the solution as obtained above under reduced pressure at room temperature to obtain 6.7 g of a contact product. The molecular weight of the product as determined by the freezing point depression method was 610.

(2) Production of styrene polymer 0.5 Parts by weight of dry method silica (Aerosil TT-600 (diameter of primary particle, 40 μm) manufactured by Degussa Co.) was added to 99.5 parts by weight of pure styrene monomer, and the resultant was mixed and stirred in a cylindrical container using T. K. Homomixer type L (manufactured by Tokushukika Kogyo Co., Ltd.) to prepare a styrene mixture. In this step, 0.1 parts by weight of calcium stearate was added.

Subsequently, in a 2 liter reactor were placed 5 mmol as aluminum atom of the contact product obtained in (1) above, 5 mmol of triisobutylaluminum, 0.025 mmol of pentamethylcyclopentadienyltitanium trimethoxide and 1 liter of the above styrene mixture, and polymerization was carried out at 90° C. for 5 hours. Then, methanol was poured to cease polymerization, and the resultant was dried to give 300 g of polymer. Subsequently, this polymer was extracted with methyl ethyl ketone using a Soxhlet extractor to give 98.0% of extraction residue (MIP). Weight average molecular weight of the resulting polymer was 390,000, and the value (weight average molecular weight)/(number average molecular weight) was 2.6. Melt viscosity (300° C.; shear rate, 200/sec) was $2 \times 10^4$ poise. The resulting polymer was confirmed to be a polystyrene having a syndiotactic configuration by measurement of melting point and $^{13}$C-NMR spectrum. The polymer composition was repeatedly washed with methanol after deashed with a solution of sodium hydroxide in methanol.

The residual titanium content, aluminum content and sodium content in this polymer composition were not more than 2 ppm, 16 ppm and 33 ppm, respectively.

The polymer was dissolved in 1,2,4-trichlorobenzene at 130° C. and the silica content in the polymer was determined. This solution was dropped onto a slide glass, and observed by a microscope to determine an average particle diameter of silica. As the result, the silica content was 0.5 wt%, and the average particle diameter was 0.08 μm.

Reference Example 2

(1) Preparation of contact product of water and aluminum compound

In a 500-milliliter glass vessel which had been purged with argon were placed 200 ml of toluene, 23.1 g (95 mmol) of copper sulfate pentahydrate ($CuSO_4.5H_2O$) and 24 ml (250 mmol) of trimethylaluminum, which were then reacted at 30° C. for 30 hours. After the reaction was over, solid component was removed from the reaction mixture to prepare a solution, and volatile components were distilled away from the solution as obtained above under reduced pressure to obtain 7.04 g of a contact product. The molecular weight of the product as determined by the freezing point depression method (in benzene solution) was 1,100.

(2) Production of styrene polymer

In a 500 ml glass vessel equipped with a stirrer were placed 50 ml of toluene and 3 mmol as aluminum atom of the contact product obtained in (1) above, then 3 mmol of triisobutylaluminum, 0.06 mmol of pentamethylcyclopentadienyltitanium trimethyl and 200 ml of styrene were added thereto, and polymerization was carried out at 70° C. for an hour. After the reaction was over, the product was washed with methanol and dried to give 36.1 g of a polymer. Weight average molecular weight of the resulting polymer was 400,000 and number average molecular weight was 200,000. The resulting polymer was confirmed to be a polystyrene having a syndiotacticity of 97% as racemic pentad by measurement of melting point and $^{13}$C-NMR spectrum. The aluminum content and titanium content were 4,500 ppm and 8 ppm, respectively.

EXAMPLE 1

The styrene polymer powder obtained in Reference Example 1 was dried in a vacuum at 150° C. for 2 hours with stirring. The powder was melt extruded by a vented uniaxial extruder equipped with a die containing several capillaries at the end thereof, then cooled and cut to prepare material for extrusion (pellet). In this step, the melt temperature was 300° C., a screw of the extruder was full flighted type with a diameter of 50 mm, extrusion rate was 30 kg/hr, and vent pressure was set at 10 mmHg. Then, the pellet was crystallized and dried in a hot air with stirring. The residual styrene monomer content in the resulting pellet was 1,100 ppm, and the crystallinity was 35%. This pellet was extruded by a vibration-proofing apparatus comprising a serial tandem type uniaxial extruder with a T-die at the tip thereof. The extrusion temperature was 320° C., and shear stress was $3 \times 10^5$ dyne/cm$^2$.

The melt extruded sheet was contacted and cooled onto a metal cooling roller by electrostatic application to prepare a raw sheet for stretching. In this step, the metal cooling roller was controlled at 70° C. The cooling rate was 50° C./sec. The thickness and crystallinity of the prepared raw sheet were 50 μm and 15%, respectively. This raw sheet was biaxially stretched in MD and TD to the extrusion direction (sequentially, by three times, each) using a table tenter at 110° C. and 3,000 %/min. Then, the stretched film thus obtained was heat treated under a state of controlling shringkage at 260° C. for 30 seconds. The thickness and crystallinity of the resulting film was 6 μm and 55%, respectively.

Dielectric dissipation factor of the film measured at 1 MHz at room temperature was 0.0008. Dielectric breakdown voltage was 307 kV/mm when measured according to ASTM D 149.

The residual monomer content in the film was 800 ppm.

EXAMPLES 2 AND 3

The procedure in Example 1 was repeated, except that extruded amount and lip opening were controlled to provide a product of the thickness shown in Table 1. Thus, a film was prepared. The results are shown in Table 1.

EXAMPLE 4

The procedure in Example 1 was repeated, except that the amount of methanol for washing in Reference Example 1 was changed to produce a styrene polymer with a residual aluminum content of 250 ppm and the obtained product was used. Thus, a film was prepared. The results are shown in Table 1.

COMPARATIVE EXAMPLE 1

The procedure in Example 1 was repeated, except that the material for molding was pelletized by a uniaxial extruder without vent, and a film was prepared. The results are shown in Table 1.

COMPARATIVE EXAMPLE 2

The procedure in Example 1 was repeated, except that a material of Reference Example 2 was used, and a film was prepared. The results are shown in Table 1.

TABLE 1

| Example No. | Residual Al Content (ppm) | Residual Monomer Content (ppm) | Thickness (μm) | Dielectric Dissipation Factor (tan δ) (1 MHz) | Dielectric Breakdown Strength* (kV/mm) |
|---|---|---|---|---|---|
| Example 1 | 75 | 800 | 6 | 0.0008 | 350 |

TABLE 1-continued

| Example No. | Residual Al Content (ppm) | Residual Monomer Content (ppm) | Thick-ness (μm) | Dielectric Dissipation Factor (tan δ) (1 MHz) | Dielectric Breakdown Strength* (kV/mm) |
|---|---|---|---|---|---|
| Example 2 | 75 | 750 | 50 | 0.0009 | 200 |
| Example 3 | 75 | 820 | 175 | 0.0009 | 150 |
| Example 4 | 250 | 760 | 6 | 0.0010 | 330 |
| Comparative Example 1 | 75 | 6,000 | 6 | 0.0045 | 125 |
| Comparative Example 2 | 4,500 | 800 | 6 | 0.0025 | 137 |

*Measured according to ASTM D-149

EXAMPLE 5

The styrene polymer powder obtained in Reference Example 1 was dried under reduced pressure at 150° C. with stirring. The powder was heated and melted at 300° C., then extruded by a biaxial extruder and cut into pellet This pellet was heated, melted at 330° C. and extruded by an apparatus comprising a serial tandem type uniaxial extruder with a T-die at the tip thereof. The shear stress was $3 \times 10^5$ dyne/cm$^2$.

The melt extruded sheet was contacted and cooled onto a metal cooling roller by electrostatic application to prepare a raw sheet for stretching. In this step, the metal cooling roller was 70° C. and cooling rate was 45° C./sec. The thickness and crystallinity of the prepared raw sheet were 50 m and 14%, respectively. This raw sheet was stretched sequentially in MD at 110° C. and 3,000%/min, and in TD at 110° C. and 3,000%/min (by three times, each) using a table tenter.

Then, the stretched film was heated and treated in a state of controlling shrinkage at 255° C. for 30 seconds. The thickness of the resulting film was 6 μm. Crystallinity measured by a differential scanning calorimeter was 49%.

The film was cut into a strip of 5.0 mm wide and 200 mm long, and aluminum was metallized in 4.0 mm width on one surface, while an edge (0.5 mm width) was left unmetallized.

Two metallized films were laminated and wound and both edge faces were treated to be conductive. Electrode pulling fitments were welded and enclosed in a jacket using an epoxy resin as transfer mold to give a condenser of the present invention.

Dielectric dissipation factor (tan δ) of the condenser was measured at room temperature and 1 kHz; at 150° C. and 1 kHz; and at room temperature and 10 kHz. Rate of change of electrostatic capacity ΔC/C was measured based on the value at room temperature and 1 kHz. Further, the change of the rate after soldering the condenser at 250° C. was determined at room temperature and 1 kHz.

EXAMPLE 6

The styrene polymer obtained in Reference Example 1 was deashed with sodium hydroxide/methanol, and repeatedly washed with methanol. The residual aluminum content, residual styrene monomer content and titanium content in this polymer were 50 ppm, 600 ppm and less than 2 ppm, respectively.

The procedure of Example 5 was repeated to prepare a condenser, except that the film of this polymer was used. The results are shown in Table 2.

EXAMPLE 7

The procedure in Example 6 was repeated except that lip-opening of T-die and take-off speed were controlled to obtain a 30 μm thick raw sheet for stretching. The thickness of the film used for dielectric was 3 μm.

EXAMPLE 8

The procedure in Example 6 was repeated except that lip-opening of a T-die and take-off speed were controlled to obtain a 160 μm thick raw sheet for stretching which was biaxially stretched and stretched in MD again by 1.5 times. Thus, a condenser was prepared. The thickness of the film used for dielectric was 12 μm.

COMPARATIVE EXAMPLE 3

The procedure in Example 5 was repeated, except that a styrene polymer of Reference Example 2 was used.

COMPARATIVE EXAMPLE 4

The procedure in Example 5 was repeated, except that the dryness of the sample was changed and biaxially stretched film containing 3,580 ppm of styrene monomer was prepared from the pellet containing 5,000 ppm of the styrene monomer, which was used as dielectric.

COMPARATIVE EXAMPLE 5

Lip opening of a T-die and take-off speed were controlled to obtain unstretched film of 12 μm thickness. The procedure of example 5 was repeated except that the film was neither stretched nor heat treated. The crystallinity of the film was 14%. The film was brittle and it was difficult to make a condenser using this film compared with the case using other films.

When the prepared condenser was heated at the temperature higher than glass transition temperature, for example, the film was cracked and sufficient characteristics were not obtained.

COMPARATIVE EXAMPLE 6

The procedure in Example 5 was repeated except that polyethylene terephthalate film (tetoron film, F-6, thickness; 6 μm) was used.

The results are shown in Table 2.

TABLE 2

| | Dielectric Film | | | | Condenser Characteristics | | | | | |
|---|---|---|---|---|---|---|---|---|---|---|
| | | | Mono- | Thick- | Dielectric Dissipation Factor (tan δ) | | | Rate of Change in[2] Electrostatic Capacity (%) | | Soldering |
| Example No. | Resin[1] | Al (ppm) | mer (ppm) | ness (μm) | 1 kHz/RT | 1 kHz/150° C. | 10 kHz/RT | 1 kHz/150° C. | 10 kHz/RT | Test[3] |
| Example 5 | SPS | 880 | 1,200 | 6 | 0.0012 | 0.0010 | 0.0018 | −3 | −1 | o |
| Example 6 | SPS | 50 | 600 | 6 | 0.0011 | 0.0011 | 0.0017 | −3 | −1 | o |
| Example 7 | SPS | 50 | 750 | 3 | 0.0010 | 0.0010 | 0.0020 | −3 | −1 | o |

TABLE 2-continued

| | Dielectric Film | | | | Condenser Characteristics | | | | | |
|---|---|---|---|---|---|---|---|---|---|---|
| | | Al | Mono-mer | Thick-ness | Dielectric Dissipation Factor (tan δ) | | | Rate of Change in[2] Electrostatic Capacity (%) | | Soldering |
| Example No. | Resin[1] | (ppm) | (ppm) | (μm) | 1 kHz/RT | 1 kHz/150° C. | 10 kHz/RT | 1 kHz/150° C. | 10 kHz/RT | Test[3] |
| Example 8 | SPS | 50 | 960 | 12 | 0.0009 | 0.0009 | 0.0016 | −3 | −1 | ○ |
| Comparative Example 3 | SPS | 4,500 | 1,030 | 6 | 0.003 | 0.002 | 0.003 | −4 | −2 | x |
| Comparative Example 4 | SPS | 880 | 3,580 | 6 | 0.004 | 0.003 | 0.004 | −4 | −2 | x |
| Comparative Example 5 | SPS | 880 | 1,200 | 12 | 0.0015 | Cannot be Measured | 0.0018 | Cannot be Measured | −1 | x |
| Comparative Example 6 | PET | — | — | 6 | 0.003 | 0.003 | 0.005 | +3 | −3 | x |

[1]SPS: Syndiotactic polystyrene, PET: Polyethylene terephthalate
[2]Rate of change (%) based on a capacity at 1 kHz at room temperature
[3]change in capacity after soldering at 250° C.
○: not exceeding 10%, x: over 10%
PET did not function as condenser because it melted.

What is claimed is:

1. An electrical insulating film which comprises a styrene polymer having a syndiotactic configuration and containing not more than 1,000 ppm of residual aluminum derived from the catalyst used in the production of the produced styrene polymer, and not more than 3,000 ppm of residual styrene monomer.

2. The electrical insulating film according to claim 1, wherein weight average molecular weight of the styrene polymer is 10,000 to 3,000,000.

3. The electrical insulating film according to claim 2, wherein
the residual aluminum content is not more than 800 ppm and the residual styrene monomer content is not more than 2,000 ppm;
the crystallinity of the styrene monomer is 25% or more; and
the syndiotacticity is at least 30% in the racemic pentad.

4. The electrical insulating film according to claim 3, wherein the film has a thickness of 0.5 to 500 μm.

5. The electrical insulating film according to claim 1, wherein weight average molecular weight of the styrene polymer is 50,000 to 1,500,000.

6. The electrical insulating film according to claim 1, wherein the residual aluminum content is not more than 800 ppm and the residual styrene monomer content is not more than 2,000 ppm.

7. The electrical insulating film according to claim 1, which is 0.5 to 12 μm thick and used as a plastic dielectric.

8. The electrical insulating film according to claim 1, which is 20 to 150 μm thick and used as a base material for a flexible printed board.

9. The electrical insulating film according to claim 1, which is 100 to 500 μm thick and used as a general insulating plate.

10. The electrical insulating film according to claim 1, which is 10 to 50 μm thick and used as an insulating tape.

11. The electrical insulating film according to claim 1, wherein crystallinity of the styrene polymer is 25% or more.

12. The electrical insulating film according to claim 1, wherein crystallinity of the styrene polymer is 30% or more.

13. A condenser which comprises metal electrodes and a 0.5 to 30 μm thick electrical insulating film of the styrene polymer according to claim 1 having crystallinity of not less than 25%.

14. The electrical insulating film according to claim 1, wherein the film has a thickness of 0.5 to 500 μm and a syndiotacticity of at least 0% in the racemic pentad.

* * * * *

UNITED STATES PATENT AND TRADEMARK OFFICE
CERTIFICATE OF CORRECTION

PATENT NO. : 5,093,758
DATED : March 3, 1992
INVENTOR(S) : FUNAKI et al It is certified that error appears in the above-identified patent and that said Letters Patent is hereby corrected as shown below:

Column 14, line 45 (claim 14), delete "0%", and insert --30%--.

Signed and Sealed this

Thirtieth Day of August, 1994

Attest:

BRUCE LEHMAN

Attesting Officer

Commissioner of Patents and Trademarks